(12) United States Patent
Yang et al.

(10) Patent No.: US 10,283,361 B1
(45) Date of Patent: May 7, 2019

(54) BLOCKING STRUCTURES ON ISOLATION STRUCTURES

(71) Applicant: Taiwan Semiconductor Manufacturing Co., Ltd., Hsinchu (TW)

(72) Inventors: Yu-Hsuan Yang, Taichung (TW); Wen Han Hung, Hsinchu (TW); Tzy-Kuang Lee, Hsinchu (TW); Chia Ying Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/840,994

(22) Filed: Dec. 13, 2017

Related U.S. Application Data

(60) Provisional application No. 62/592,253, filed on Nov. 29, 2017.

(51) Int. Cl.

| | | |
|---|---|---|
| *H01L 21/027* | (2006.01) | |
| *H01L 29/06* | (2006.01) | |
| *H01L 21/266* | (2006.01) | |
| *H01L 21/762* | (2006.01) | |
| *H01L 29/40* | (2006.01) | |
| *H01L 29/808* | (2006.01) | |
| *H01L 29/66* | (2006.01) | |

(52) U.S. Cl.
CPC ........ *H01L 21/0274* (2013.01); *H01L 21/266* (2013.01); *H01L 21/76224* (2013.01); *H01L 29/0649* (2013.01); *H01L 29/402* (2013.01); *H01L 21/76229* (2013.01); *H01L 29/6659* (2013.01); *H01L 29/808* (2013.01)

(58) Field of Classification Search
CPC ............. H01L 21/76229; H01L 21/033; H01L 21/2205; H01L 29/808; H01L 27/0629; H01L 27/0992; H01L 28/20; H01L 29/6659
USPC ............... 438/196, 248, 218, 207, 359, 391; 257/510, 501, 506, 374, 446, E29.02
See application file for complete search history.

(56) References Cited

U.S. PATENT DOCUMENTS

| | | |
|---|---|---|
| 6,171,764 B1 | 1/2001 | Ku et al. |
| 2010/0052060 A1 | 3/2010 | Lai et al. |
| 2010/0059823 A1* | 3/2010 | Chung et al. ... H01L 21/823878 257/355 |
| 2011/0057267 A1 | 3/2011 | Chuang et al. |

(Continued)

FOREIGN PATENT DOCUMENTS

CN 102237310 A 11/2011

*Primary Examiner* — Thinh T Nguyen
(74) *Attorney, Agent, or Firm* — Haynes and Boone, LLP

(57) ABSTRACT

A method for fabricating a semiconductor device includes forming a plurality of isolation structures in a semiconductor substrate and forming a plurality of blocking structures over the isolation structures. The blocking structures have a lower reflectivity than the isolation structures. The method further includes forming a photoresist layer on the semiconductor substrate, exposing the photoresist layer to a light source through a mask, and developing the photoresist layer to create a patterned photoresist feature that covers a first region of a portion of the semiconductor substrate between two of the isolation structures. The portion of the semiconductor substrate having a second region that is exposed.

20 Claims, 12 Drawing Sheets

(56) References Cited

U.S. PATENT DOCUMENTS

2011/0227161 A1 9/2011 Zhu et al.
2014/0312410 A1* 10/2014 Park .................... H01L 29/4234
 257/325
2016/0097315 A1 4/2016 Becker et al.

* cited by examiner

BLOCKING STRUCTURES ON ISOLATION STRUCTURES

PRIORITY INFORMATION

This application is a non-provisional application that claims the benefit of U.S. Provisional Patent No. 62/592,253 filed Nov. 29, 2017 and entitled "Blocking Structures on Isolation Structures," the disclosure of which is hereby incorporated by reference in the entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One process commonly used in semiconductor fabrication is photolithography. Photolithography involves depositing a photoresist onto a substrate. The photoresist is then exposed to a light source through a photomask. Depending on the type of photoresist, either the exposed portions are unexposed portions of the photoresist are removed in a development process. The remaining photoresist features may then act as a mask for further processes. For example, and implantation process may then be applied to the substrate. Such implanting process will only be applied to portions of the substrate not covered by the remaining photoresist features. Due to the small scale of such features, it is desirable to improve the accuracy of the photolithography process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
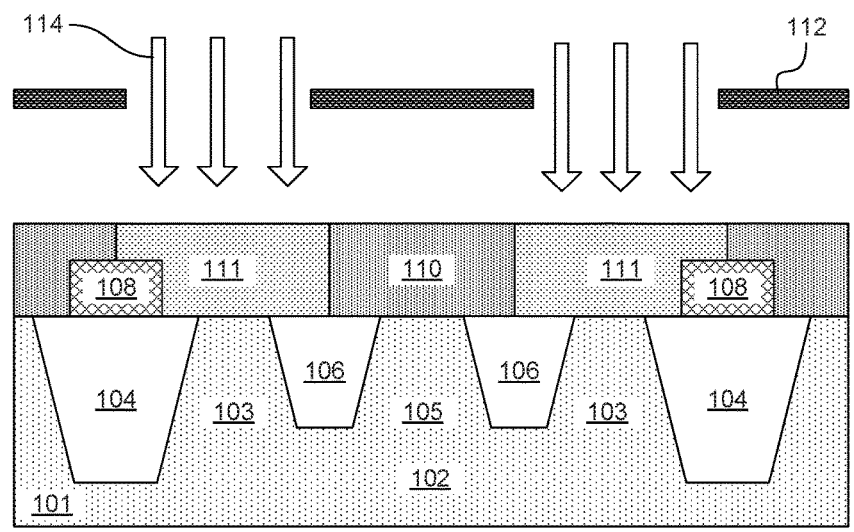
FIGS. 1A, 1B, 1C, and 1D are diagrams showing a fabrication process that utilizes blocking structures on isolation structures to improve the photolithography process, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, one process commonly used in semiconductor fabrication is photolithography. Photolithography involves depositing a photoresist onto a substrate. The photoresist is then exposed to a light source through a photomask. Depending on the type of photoresist, either the exposed portions are unexposed portions of the photoresist are removed in a development process. The remaining photoresist features may then act as a mask for further processes. For example, and implantation process may then be applied to the substrate. Such implanting process will only be applied to portions of the substrate not covered by the remaining photoresist features. Due to the small scale of such features, it is desirable to improve the efficiency and accuracy of photolithography processes. In some cases, a photoresist layer is deposited onto a workpiece that includes isolation structures, such as shallow trench isolation (STI) structures. When the photoresist pattern is exposed to a light source through a photomask, such isolation structures may reflect some of the light and cause more portions of the photoresist layer to be exposed and desired. This may result in the remaining photoresist features being smaller than desired. Thus, subsequent processes, such as implantation processes, may be applied to portions of the workpiece on which the implantation process is not intended to be applied.

According to principles described herein, a blocking structure is formed on top of some of the isolation structures within a circuit. The blocking structure has a reflectivity that is less than that of the isolation structure. This reduces the amount of light that is reflected during the photolithography exposure process. Thus, the accuracy of the photolithography process may be improved through use of such blocking structures.

FIGS. 1A, 1B, 1C, and 1D are diagrams showing a fabrication process that utilizes blocking structures on isolation structures to improve the photolithography process. FIG. 1A illustrates a semiconductor substrate 101 with a plurality of isolation structures 104, 106. According to the present example, blocking structures 108 are formed on top of isolation structures 104, while no blocking structures are formed on isolation structures 106. The photoresist layer 110 is then deposited onto the substrate 101 and exposed to a light source 114 through a photomask 112.

The substrate 101 may be a semiconductor substrate such as a silicon substrate. Other semiconductor substrate materials such as compound semiconductor materials may be used as well. In some examples, the substrate 101 may be lightly doped with a p-type dopant such as boron, or an n-type dopant such as arsenic. The substrate 101 may be part of a semiconductor wafer used in semiconductor fabrication processes. Such wafers are often circular and about 300 millimeters in diameter. Other sizes may be used as well.

The isolation structures 104, 106 are formed to isolate certain portions of the semiconductor substrate from other portions. In the present example, isolation structures 104 isolate a portion 102 of the semiconductor substrate 101. In one example, the isolation structures 104, 106 are shallow trench isolation (STI) structures. The isolation structures 104, 106 may be formed in a variety of manners. In one example, an etching process is used to as a pattern of trenches in the semiconductor substrate 101. These trenches may then be filled with a dielectric material such as silicon oxide. Then, a chemical mechanical polishing (CMP) process may be applied to planarize the top of the isolation structures and substrate 101 and to remove any excess dielectric material.

After the isolation structures 104, 106 are formed, blocking structures 108 may be formed on some, but not necessarily all, of the isolation structures 104, 106. In the present example, isolation structures 104 have blocking structures 108 formed thereon. Isolation structures 106 do not have blocking structures formed thereon.

In general, the blocking structures 108 have a lower reflectivity than that of the isolation structures 104, 106. The blocking structures 108 may be formed of a variety of materials. In one example, the blocking structures 108 may be a dummy polysilicon gate structure. In such an example, the blocking structures 108 may be formed at the same time the real polysilicon gate structures are formed. Real polysilicon gate structures are those that are eventually replaced with a metal gate. Such a replacement process, however, may not be applied to dummy polysilicon blocking structures 108. The blocking structures 108 may also have sidewall spacers formed thereon. The sidewall spacers may include, for example, a nitride material. The sidewall spacers may also have a lower reflectivity than the isolation structures.

Other materials may be used to form the blocking structures 108. For example, the blocking structures may include metal lines formed from a metal with a low reflectivity. The blocking structures 108 may also be formed as nitride features. In such examples, a nitride layer may be deposited onto the substrate 101. Then, an etching process may be applied to pattern the nitride layer as desired. In such examples, the nitride material may have a high etching selectivity with the isolation structures 104, 106 so that the etching process used to pattern the nitride material has little effect on the isolation structures 104, 106.

After the blocking structures 108 are formed, a photoresist layer 110 is deposited onto the substrate 101. The photoresist layer 110 may be deposited, for example, by a spin coating process. The photoresist layer may then be exposed to light 114 through a photomask 112. The light 114 chemically changes the exposed portions 111 of the photoresist layer 110. More specifically, the light 114 makes the exposed portions 111 soluble to a developing solution. Without use of the blocking structures 108, the light 114 that penetrates the photoresist 110 may reflect off of the isolation structures 104 and hit the side of the portions of the photoresist not exposed to the light 114 directly. This may undesirably expand the size of the soluble portions 111.

Figure 1B:
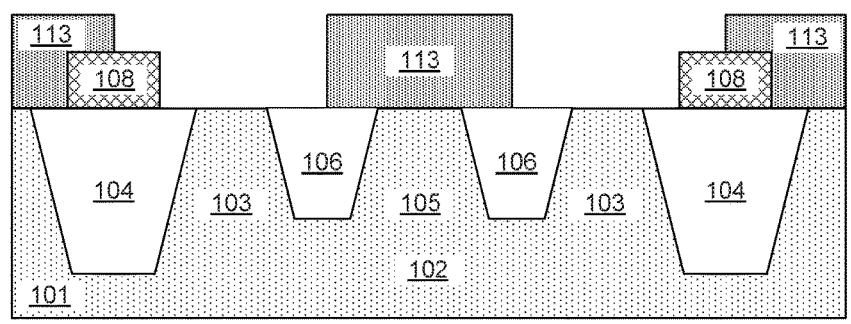

After the exposure process, a developing process is applied to remove the exposed portions 111 of the photoresist layer 110 as shown in FIG. 1B. Removing the exposed portions 111 exposes portions 103 of the substrate 101 and leaves photoresist features 113 as shown. Other portions 105 of the substrate 101 remain covered by photoresist features 113.

Figure 1C:
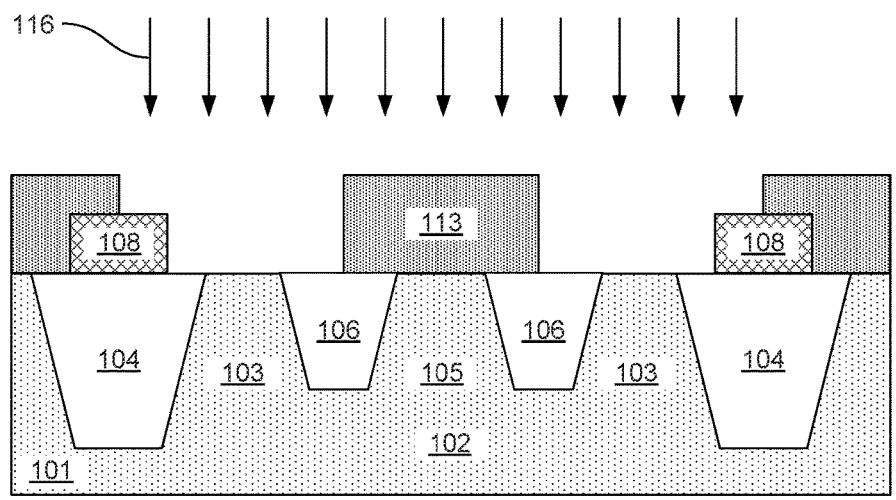

FIG. 1C illustrates a subsequent fabrication process such as an implantation process 116. The implantation process 116 may be used to introduce a dopant species into the exposed portions 103 of the semiconductor substrate 101. Without use of the blocking structures 108, it is possible that the remaining photoresist feature 113 may be reduced in size such that small sections of portion 105 are exposed. This would be undesirable because it may allow sections of portion 105 to be inadvertently doped. In general, it may be desirable that photoresist feature 113 overlap at least 50% of the isolation structures 106.

Figure 1D:
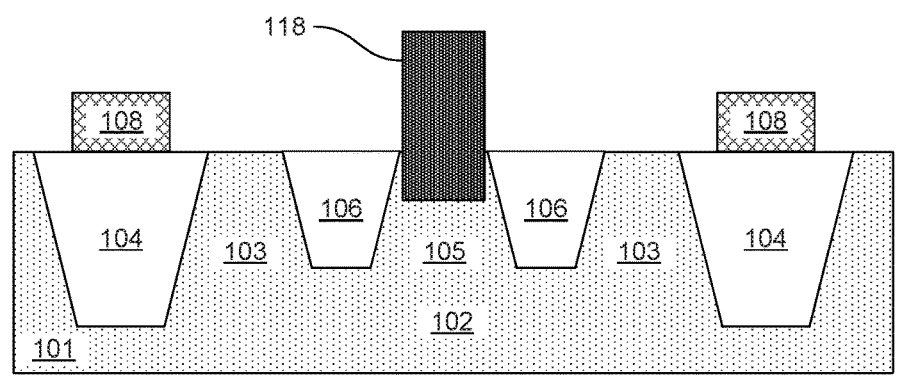

After the implantation process 116, the remaining photoresist features 113 may be removed as shown in FIG. 1D by using an ashing process. For purposes of discussion, reference numeral 102 identifies the portion 102 of the semiconductor substrate 101 between isolation features 104 having blocking structures formed thereon. Reference numeral 103 identifies sub-portions of portion 102 that are exposed to the fabrication process 116. Reference numeral 105 identifies sub-portions of the portion 102 that are covered by the photoresist features 113 and are thus not intended to be affected by the fabrication process 116.

After the photoresist features 113 are removed, semiconductor devices 118 such as diodes or transistors may be formed within/on the semiconductor substrate 101. Specifically, semiconductor devices may be formed in either sub-portions 103 or sub-portions 105. Forming diodes may involve subsequent doping processes as well as forming contacts to connect to connect to the doped semiconductor portions. Forming transistors may involve forming gate devices, doping areas adjacent the gate devices, and forming contacts to the gates and areas (source/drain regions) adjacent the gate devices. Such devices will have improved performance due to the accuracy of photolithography process described herein.

Figure 2:
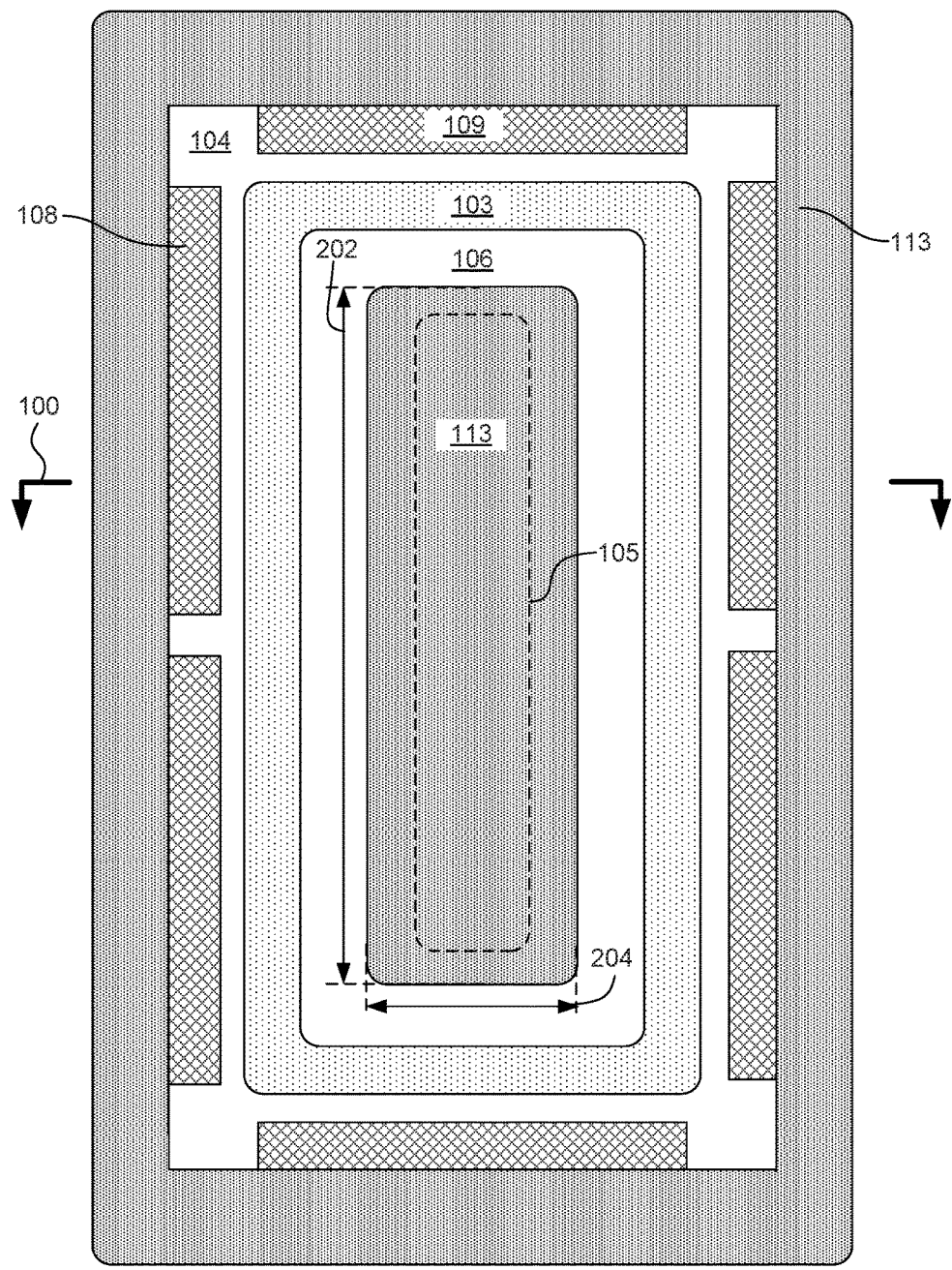
FIG. 2 is a diagram showing a top view of blocking structures on isolation structures, according to one example of principles described herein.

FIG. 2 is a diagram showing a top view of blocking structures 108 formed on isolation structures 104. The dotted line 100 shows where the cross-section of FIG. 1C is taken. According to the present example, the isolation structures 104 circumscribe the sub-portions 103 of the semiconductor substrate 101. Additionally, the sub-portions 103 circumscribe isolation feature 106. Isolation feature 106 circumscribes the covered sub-portion 105. Isolation feature 113 covers sub-portion 105.

The size and shape of the blocking structures 108 may be designed in accordance with the desired size and shape of the photoresist feature 113. For example, the blocking structure 108 may be in a line along a first dimension 202 such that the total length of all portions of 108 along that dimension is at least 50% of the length of photoresist feature 113 along the same dimension. In other words, the blocking structure 108a is present along at least 50% of the length 202 of the photoresist feature 113. In some examples, the blocking structure 108 may be present 100% of the length 202. Additionally, a second dimension 204, such as the width 204 of the photoresist feature 113 may have at least 50% coverage of the blocking structure 109. In other words, the blocking structure 109 is present along at least 50% of the width 204 of the photoresist feature 113.

FIGS. 3A, 3B, 3C, 3D, 3E, 3F, 3G, and 3H are diagrams showing various features that may be formed between blocking structures. FIGS. 1A-1D illustrate one example of the features that may be positioned between the isolation structures 104 having blocking structures 108 formed thereon. FIGS. 3A-3H illustrate other variations of features between isolation structures 104.

Figure 3A:
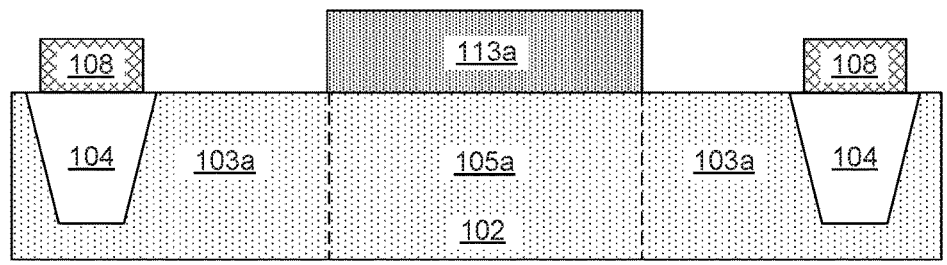
FIGS. 3A, 3B, 3C, 3D, 3E, 3F, 3G, and 3H are diagrams showing various features that may be formed between blocking structures, according to one example of principles described herein.

FIG. 3A illustrates an example in which there are no additional isolation structures (such as isolation structures 106) positioned between the isolation structures 104. In FIG. 3A, the portion 102 between the isolation structures 104 includes sub-portions 103a that are exposed and sub-portion 105a that is covered by photoresist feature 113a.

Figure 3B:
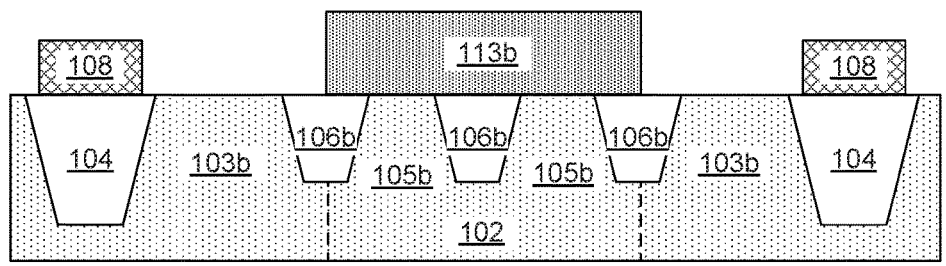

FIG. 3B illustrates an example in which, in cross-section, there are more than two isolation structures 106b without blocking structures positioned between the isolation structures with blocking structures 108 formed thereon. The photoresist feature 113b covers multiple sub-portions 105b between each of the isolation structures 106. The portions 103b remain exposed.

Figure 3C:
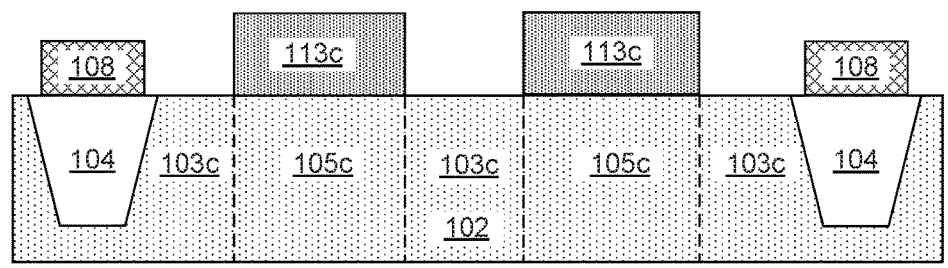

FIG. 3C illustrates an example in which, in cross-section, there are two photoresist features 113c and no additional isolation structures (such as isolation structures 106) positioned between the isolation structures 104. Thus, there are two separated sub-portions 105c covered by the photoresist features 113c. The remaining sub-portions 103c remain exposed.

Figure 3D:
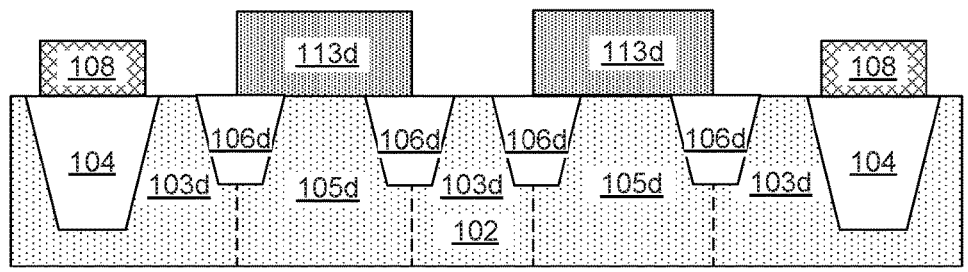

FIG. 3D illustrates an example in which, in cross-section, there are at least two photoresist features 113d having isolation structures 106d on both ends. Thus, there are at least two separated sub-portions 105d surrounded by isolation structures 106d. In other examples, there may be more separated sub-portions 105d surrounded by additional isolation structures 106d. The sub-portions 103d between the separated sub-portions 105d remain exposed.

Figure 3E:
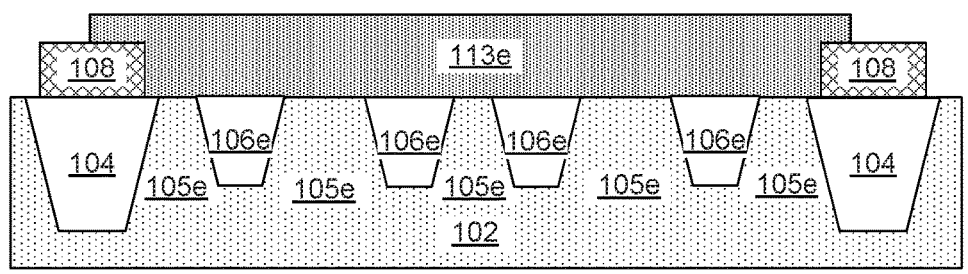

FIG. 3E illustrates an example in which, in cross-section, the photoresist feature 113e extends all the way between the two isolation structures 104 with blocking structures 108 thereon. Additionally, there are multiple isolation structures 106e between the two isolation features 104. Each sub-portion 105e between the isolation structures 104 is covered by the photoresist feature. In other examples, there may be more isolation structures 106e between the isolation structures 104.

Figure 3F:
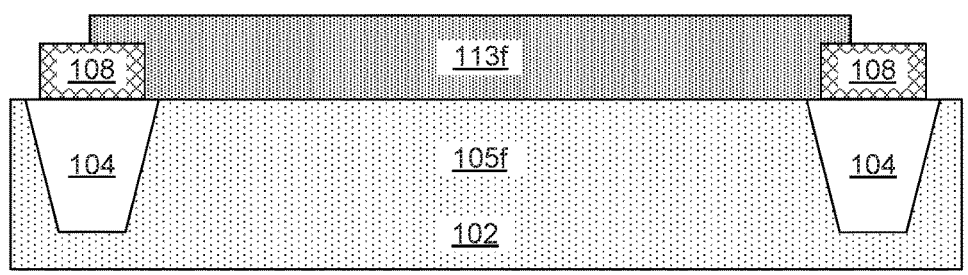

FIG. 3F illustrates an example in which, in cross-section, the photoresist feature 113f extends all the way between the two isolation structures 104 with blocking structures 108 thereon. However, there are no isolation structures (such as isolation structures 106) between the two isolation structures 104. Thus, the entire portion 105f between the isolation structures 104 is covered by the photoresist feature 113f.

Figure 3G:
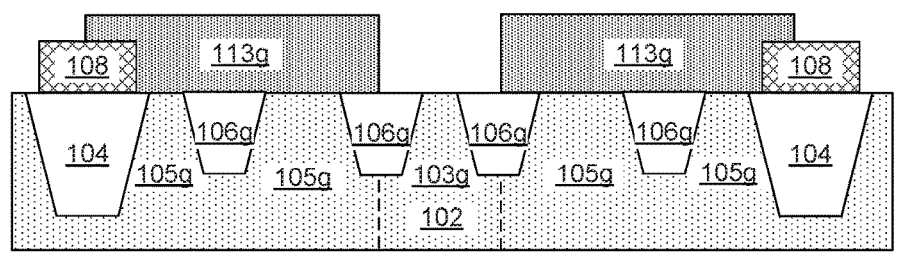

FIG. 3G illustrates an example in which, in cross-section, two photoresist features 113g extend inward from the isolation structures 104 but are not connected. In other words, there is an exposed sub-portion 103g between the photoresist features 113g. Additionally, there are multiple isolation structures 106g between the isolation structures 104. The photoresist features cover sub-portions 105g.

Figure 3H:
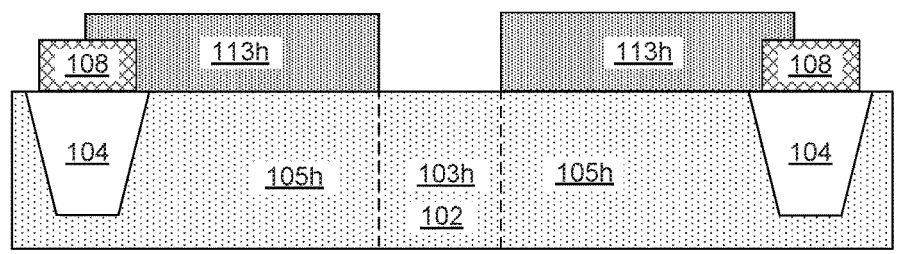

FIG. 3H illustrates an example in which, in cross-section, two photoresist features 113h extend inward from the isolation structures 104 but are not connected. In other words, there is an exposed sub-portion 103h between the photoresist features 113h. Additionally, there are no isolation structures 106 (such as isolation structures 106) between the isolation structures 104. The photoresist features 113h cover sub-portions 105h, leaving sub-portion 103h exposed.

Figure 4:
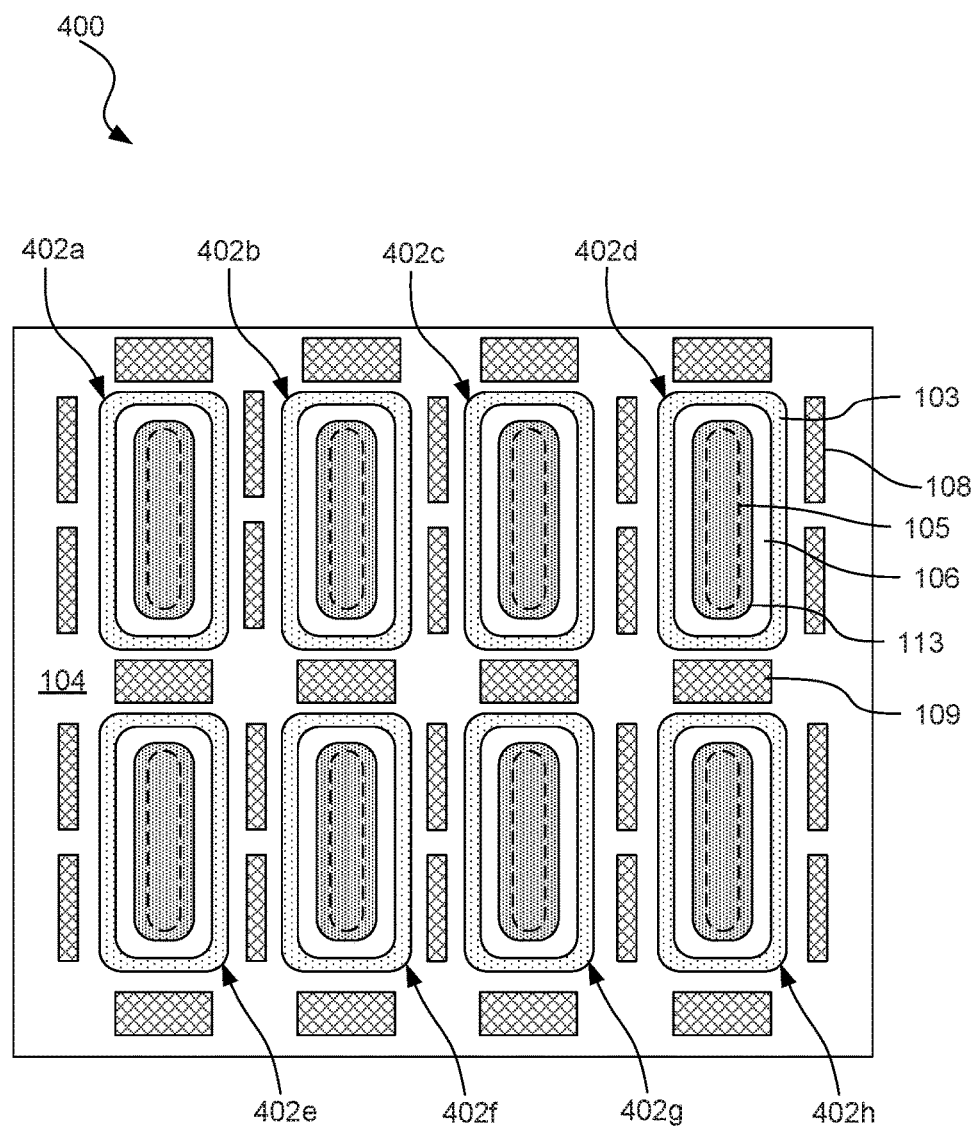
FIG. 4 is a top view of an array of blocking structures on isolation structures, according to one example of principles described herein.

FIG. 4 is a top view of an array of blocking structures 108 on isolation structures. In the present example, the array 400 includes eight units 402a, 402b, 402c, 402d, 402e, 402f, 402g, 402h. Practical implementations of such arrays may include substantially more units. Each unit 402a, 402b, 402c, 402d, 402e, 402f, 402g, 402h may share blocking structures 108 with adjacent units. For example, unit 402b may share blocking structures with 402a and 402c along one dimension. Additionally, unit 402b may share blocking structures 109 with unit 402f along a different direction.

Figure 5A:
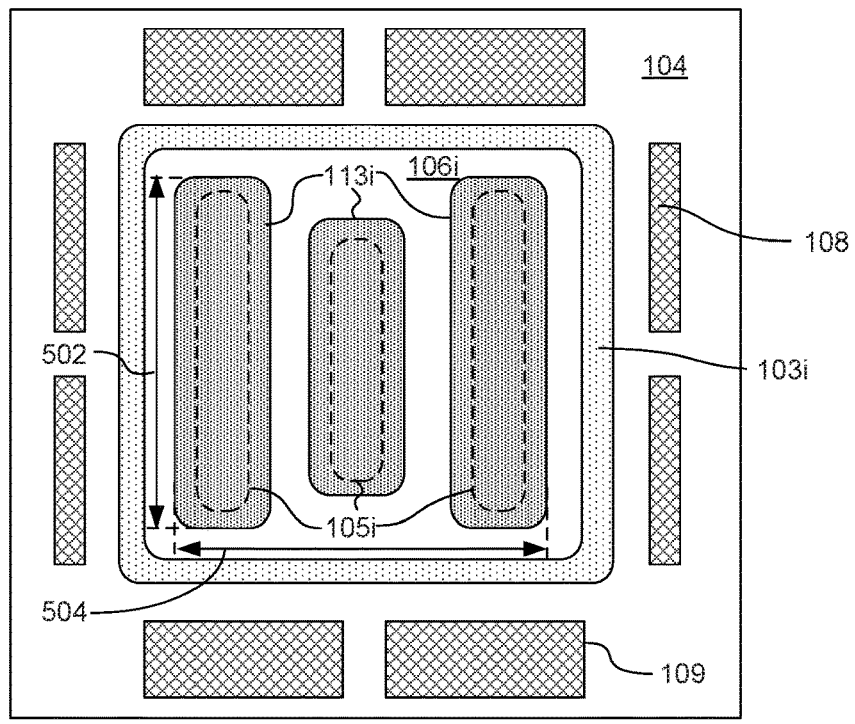
FIGS. 5A, 5B, 5C, and 5D are diagrams showing a top view of various features may be formed between blocking structures on isolation structures, according to one example of principles described herein.

FIGS. 5A, 5B, 5C, and 5D are diagrams showing a top view of various features may be formed between blocking structures on isolation structures. FIG. 5A illustrates a unit 501 in which the isolation structure 104 circumscribes a sub-portion 103i and an isolation structure 106i. The isolation structure 106i isolates three separate sub-portions 105i covered by photoresist features 113i. Together, the three separate photoresist features 113i define a first dimension 502 and a second dimension 504 that is perpendicular to the first dimension.

The size and shape of the blocking structures 108 may be designed in accordance with the desired size and shape of the photoresist features 113i. For example, the blocking structure 108 may be in a line along a first dimension 502 such that the total length of all portions of 108 along that dimension is at least 50% of the length of photoresist feature 113i along the same dimension. In other words, the blocking structure 108 is present along at least 50% of the first dimension 502 of the photoresist features 113i. In some examples, the blocking structure 108 may be present 100% of the first dimension 502. Additionally, a second dimension 504 of the photoresist features 113i may have at least 50% coverage of the blocking structure 109. In other words, the blocking structure 108 is present along at least 50% of the second dimension 204 of the photoresist features 113.

Figure 5B:
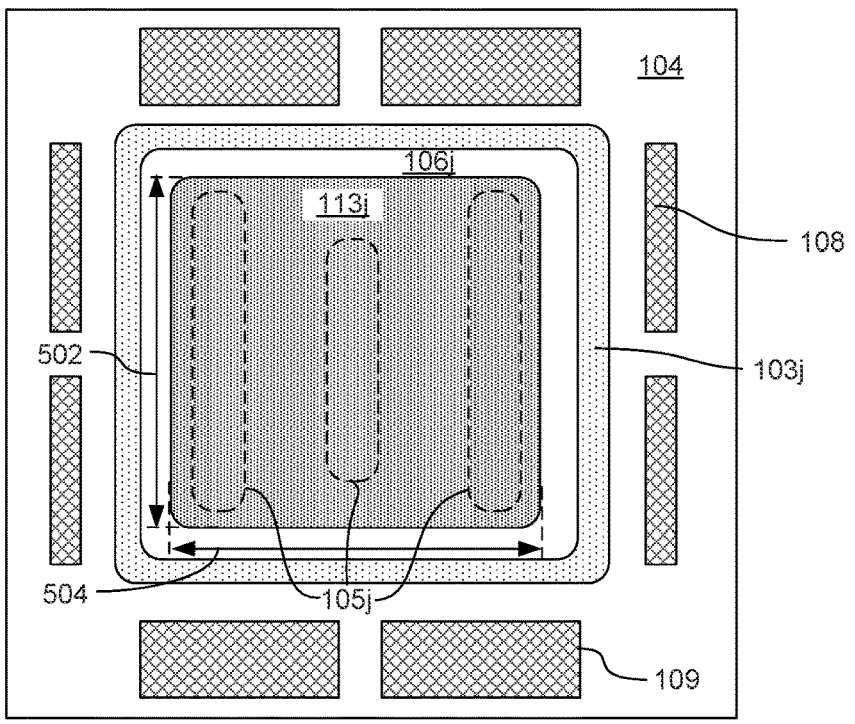

FIG. 5B is a unit 503 in which a single photoresist feature 113j covers each of the sub-portions 105j. The isolation structure 106j isolates three separate sub-portions 105j covered by the photoresist feature 113j. The photoresist feature 113j is defined by the first dimension 502 and the second dimension 504. For example, the blocking structure 108 may be in a line along a first dimension 502 such that the total length of all portions of 108 along that dimension is at least 50% of the length of photoresist feature 113j along the same dimension. In other words, the blocking structure 108 is present along at least 50% of the first dimension 502 of the photoresist features 113j. In some examples, the blocking structure 108 may be present 100% of the first dimension

502. Additionally, a second dimension 504 of the photoresist features 113*j* may have at least 50% coverage of the blocking structure 109. In other words, the blocking structure 108 is present along at least 50% of the second dimension 504 of the photoresist features 113*j*.

Figure 5C:
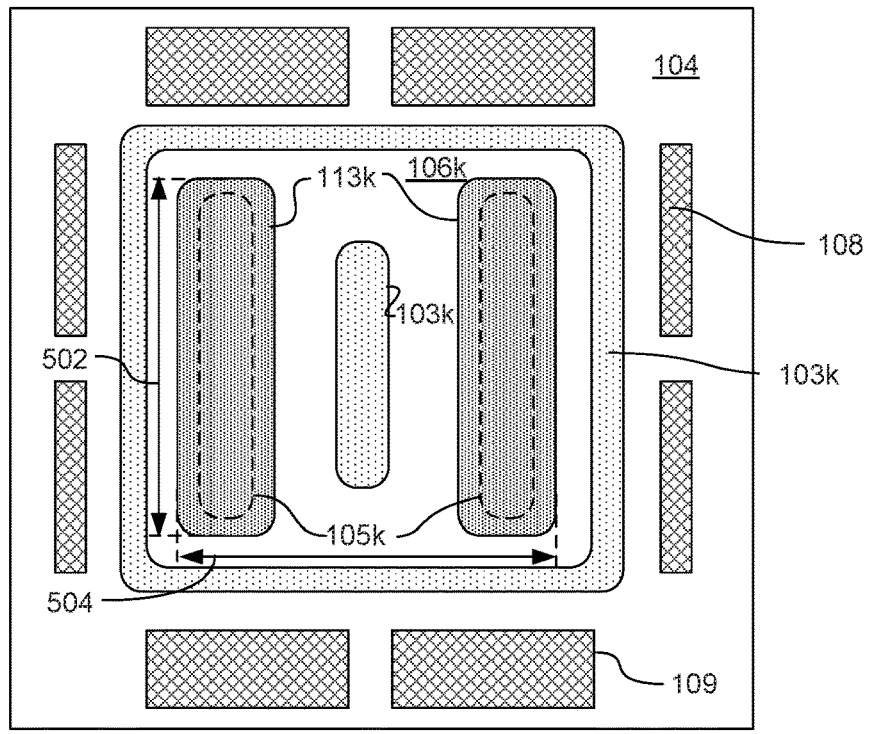

FIG. 5C is a unit 505 in which there are two photoresist features 113*k* covering the sub-portions 105*k* while sub-portion 103*k* is exposed. The isolation structure 106*k* isolates three separate sub-portions 103*k*, 105*k*. The two photoresist features 113*k* together may be defined by a first dimension 502 and a second dimension 504. For example, the blocking structure 108 may be in a line along a first dimension 502 such that the total length of all portions of 108 along that dimension is at least 50% of the length of photoresist feature 113*k* along the same dimension. In other words, the blocking structure 108 is present along at least 50% of the first dimension 502 of the photoresist features 113*k*. In some examples, the blocking structure 108 may be present 100% of the first dimension 502. Additionally, a second dimension 504 of the photoresist features 113*k* may have at least 50% coverage of the blocking structure 109. In other words, the blocking structure 109 is present along at least 50% of the second dimension 204 of the photoresist features 113*k*.

Figure 5D:
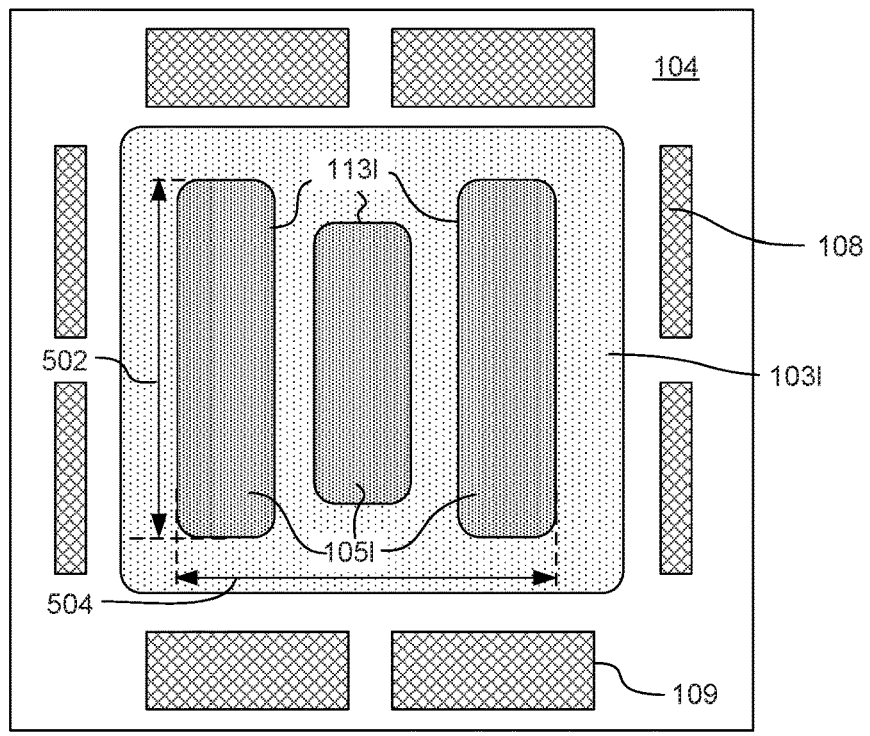

FIG. 5D is a unit 507 in which there is no isolation structure 106*l* circumscribed by the isolation structure 104. Additionally, there are three separate photoresist features 113*l* that cover sub-portions 105*l*, thus leaving sub-portions 103*l* exposed. Together, the three photoresist features 113*l* define a first dimension 502 and a second dimension 504. For example, the blocking structure 108 may be in a line along a first dimension 502 such that the total length of all portions of 108 along that dimension is at least 50% of the length of photoresist feature 113*l* along the same dimension. In other words, the blocking structure 108 is present along at least 50% of the first dimension 502 of the photoresist features 113*l*. In some examples, the blocking structure 108 may be present 100% of the first dimension 502. Additionally, a second dimension 504 of the photoresist features 113*l* may have at least 50% coverage of the blocking structure 108. In other words, the blocking structure 108 is present along at least 50% of the second dimension 204 of the photoresist features 113*l*.

Figure 6:
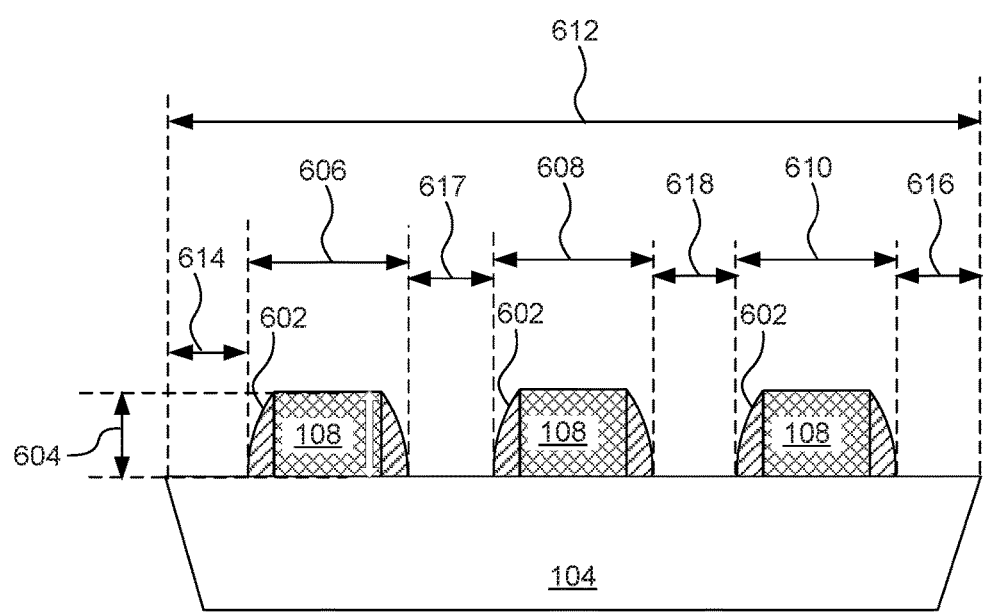
FIG. 6 is a diagram showing a cross-section of blocking structures on isolation structure, according to one example of principles described herein.

FIG. 6 is a diagram showing a cross-section of multiple blocking structures 108 on an isolation structure 104. According to the present example, a particular isolation structure may include a series of blocking structures extending in parallel. In the present example, the blocking structures are dummy gate devices such as polysilicon gate devices. Additionally, the blocking structures 108 have sidewall spacers 602 formed thereon. The sidewall spacers 602 may be a nitride material and may be formed at the same time sidewall spacers are formed on real gates, or gates that will be replaced with real metal gates.

In the present example, the sum of the widths 606, 608, 610 of each of the blocking structures 108 may be at least 30% of the width 612 of the top surface of the isolations structure 104. In some examples, the distances 614, 616 between the blocking structures 108 and the edges of the isolation structure 104 may be equal. In some examples, the distances 614, 616 may be different. In some examples, the distances 617, 618 between the blocking structures 108 may be similar. In some examples, however, the distances 617, 618 may be different. In some examples, the height 604 of each of the blocking structures 108 may be about 500 nanometers. In some examples, the height of the blocking structures may be within a range of about 450 nanometers and 550 nanometers. Such a height and range allows for sufficient absorption of light during the photolithography process without interfering with conventional semiconductor fabrication processes. In some examples, the height 604 may be less than 500 nanometers. In some examples, the height 604 of the blocking structures 108 may be greater than 500 nanometers.

Figure 7:
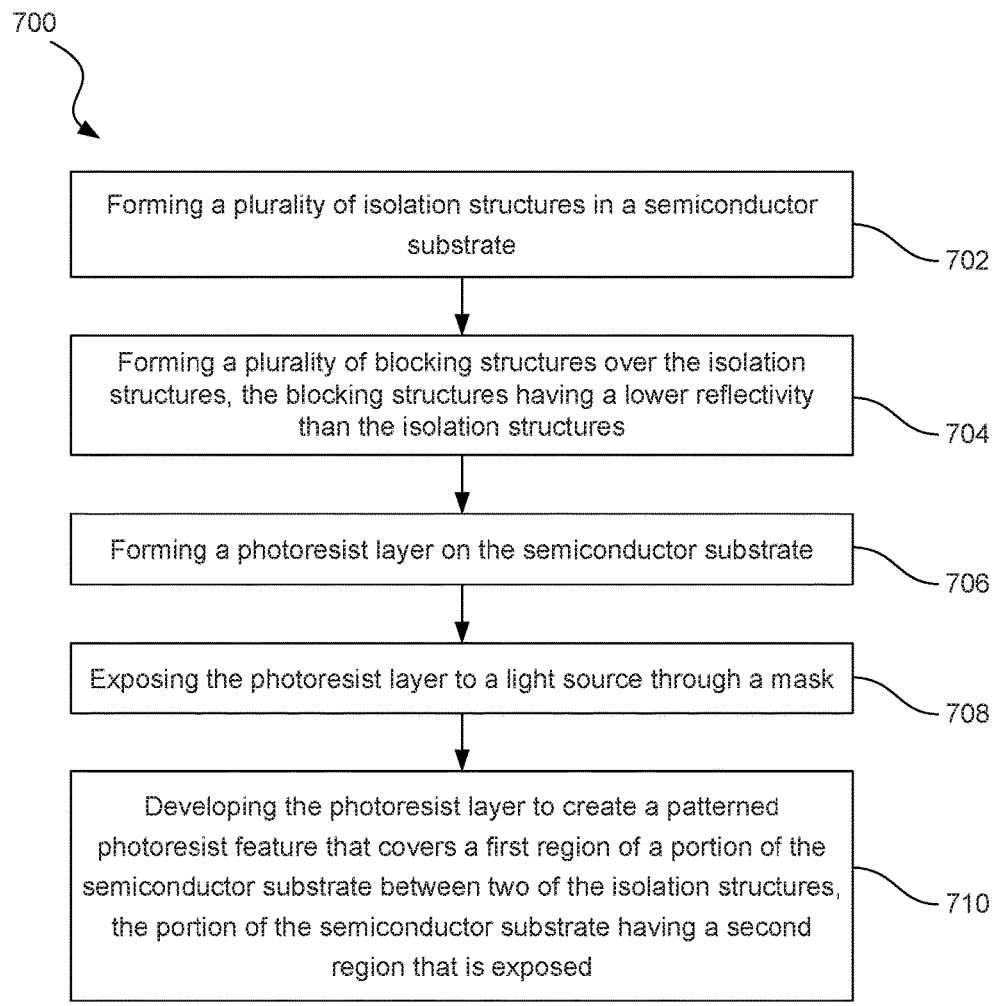
FIG. 7 is a flowchart showing an illustrative method for fabricating a semiconductor device using blocking structures on isolation structures, according to one example of principles described herein.

FIG. 7 is a flowchart showing an illustrative method for fabricating a semiconductor device using blocking structures on isolation structures. According to the present example, a method for fabricating a semiconductor device includes a process 702 for forming a plurality of isolation structures in a semiconductor substrate. The isolation structures (e.g., 104, FIG. 1A) are formed to isolate certain portions of the semiconductor substrate from other portions. In the present example, isolation structures isolate a portion (e.g., 102, FIG. 1A) of the semiconductor substrate 101. In one example, the isolation structures are STI structures. STI structures may be formed in a variety of manners. In one example, an etching process is used to as a pattern of trenches in the semiconductor substrate. These trenches may then be filled with a dielectric material such as silicon dioxide. Then, a chemical mechanical polishing (CMP) process may be applied to planarize the top of the isolation structures and substrate and to remove any excess dielectric material.

According to the present example, the method 700 includes a process 704 for forming a plurality of blocking structures (e.g., 108, FIG. 1A) over the isolation structures, the blocking structures having a lower reflectivity than the isolation structures. The blocking structures may be formed on some, but not necessarily all, of the isolation structures. The blocking structures 108 may be formed of a variety of materials. In one example, the blocking structure may be a dummy polysilicon gate structure. In such an example, the blocking structures may be formed at the same time the real polysilicon gate structures are formed. Real polysilicon gate structures are those that are eventually replaced with a metal gate. Such a replacement process, however, may not be necessary for the blocking structures. The blocking structures may also have sidewall spacers formed thereon. The sidewall spacers include, for example, a nitride material. The sidewall spacers may also have a lower reflectivity than the isolation structures.

Other materials may be used to form the blocking structures. For example, the blocking structures may include metal lines formed from a metal with a low reflectivity. The blocking structures may also be formed as nitride features. In such examples, a nitride layer may be deposited onto the substrate. Then, an etching process may be applied to pattern a nitride material is desired. In such examples, the natural material may have a high etching selectivity with the isolation structures so that the etching process used to pattern the nitride material has little effect on the isolation structures.

The method 700 further includes a process 706 for forming a photoresist layer (e.g., 110) on the semiconductor substrate. The photoresist layer may be deposited, for example, by a spin coating process. The photoresist may be, for example, a positive photoresist.

According to the present example, the method 700 further includes a process 708 for exposing the photoresist layer to a light source through a mask. The light chemically changes the exposed portions of the photoresist layer. More specifically, the light makes the exposed portions soluble to a developing solution. Without use of the blocking structures, the light that penetrates the photoresist may reflect off of the isolation structures and expand the size of the soluble portions undesirably.

According to the present example, the method 700 further includes a process 710 for developing the photoresist layer to create a patterned photoresist feature that covers a first sub-portion (e.g., 105, FIG. 1A) of a portion (e.g., 102, FIG. 1A) of the semiconductor substrate between two of the isolation structures. There may also be a portion of the semiconductor substrate having a second sub-portion (e.g., 103, FIG. 1A) that is exposed.

After the development process, further fabrication processes may be applied to the substrate. For example, an ion implantation process (e.g., 116, FIG. 1C) may be applied. The implantation process may be used to introduce a dopant species into the exposed portions of the semiconductor substrate. Without use of the blocking structures, it is possible that the remaining photoresist features may be reduced in size such that small sections of portion are exposed. This would be undesirable because it may allow sections of the exposed portions to be inadvertently doped.

After the implantation process, the remaining photoresist features may be removed. After the photoresist features are removed, semiconductor devices such as diodes transistors may be formed within the semiconductor substrate. Specifically, semiconductor devices may be formed in either exposed sub-portions or covered sub-portions. Forming diodes may involve further doping processes in forming contacts to connect to connect to the doped semiconductor portions. Forming transistors may involve forming gate devices, doping areas adjacent the gate devices, and forming contacts to the gates and areas (source/drain regions) adjacent the gate devices. Such devices will have improved performance due to the accuracy of photolithography process described herein.

Figure 8:
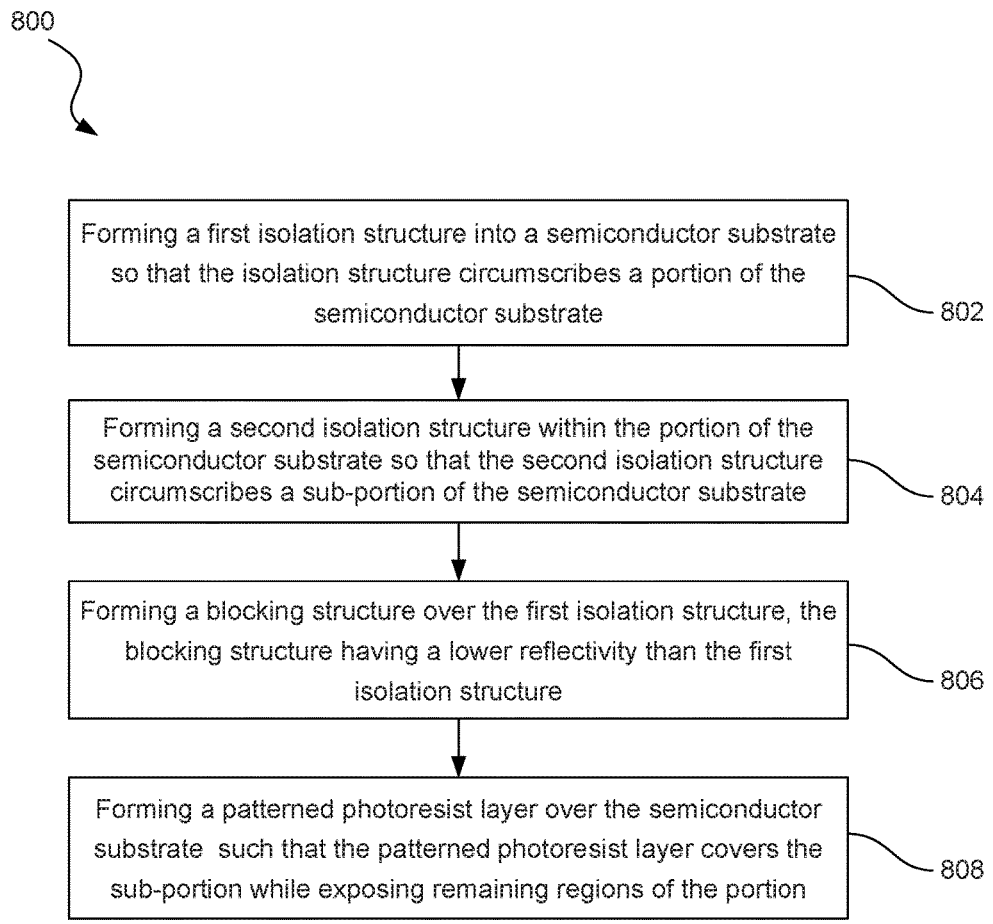
FIG. 8 is a flowchart showing an illustrative method for fabricating a semiconductor device using blocking structures on isolation structures, according to one example of principles described herein.

FIG. 8 is a flowchart showing an illustrative method for fabricating a semiconductor device using blocking structures on isolation structures. According to the present example, the method 800 includes a process 802 for forming a first isolation structure (e.g., 104, FIG. 2) into a semiconductor substrate so that the isolation structure circumscribes a portion (e.g., 102, FIG. 2) of the semiconductor substrate. In one example, the isolation structures are STI structures. STI structures may be formed in a variety of manners. In one example, an etching process is used to as a pattern of trenches in the semiconductor substrate. These trenches may then be filled with a dielectric material such as silicon dioxide. Then, a chemical mechanical polishing (CMP) process may be applied to planarize the top of the isolation structures and substrate and to remove any excess dielectric material.

According to the present example, the method 800 includes a process 804 for forming a second isolation structure (e.g., 106, FIG. 2) within the portion of the semiconductor substrate so that the second isolation structure circumscribes a sub-portion (e.g., 105, FIG. 2) of the semiconductor substrate. The second isolation structure may also be an STI structure. Both isolation structures may have a substantially rectangular shape from a top perspective. However, other shapes are contemplated.

According to the present example, the method 800 includes a process 806 for forming a blocking structure over the first isolation structure. The blocking structure may have a lower reflectivity than the first isolation structure. The blocking structures may be formed on some, but not necessarily all, of the isolation structures. The blocking structures 108 may be formed of a variety of materials. In one example, the blocking structure may be a dummy polysilicon gate structure. In such an example, the blocking structures may be formed at the same time the real polysilicon gate structures are formed. Real polysilicon gate structures maybe those that are eventually replaced with a metal gate. Such a replacement process, however, may not be necessary for the blocking structures. The blocking structures may also have sidewall spacers formed thereon. The sidewall spacers include, for example, a nitride material. The sidewall spacers may also have a lower reflectivity than the isolation structures.

Other materials may be used to form the blocking structures. For example, the blocking structures may include metal lines formed from a metal with a low reflectivity. The blocking structures may also be formed as nitride features. In such examples, a nitride layer may be deposited onto the substrate. Then, an etching process may be applied to pattern a nitride material is desired. In such examples, the natural material may have a high etching selectivity with the isolation structures so that the etching process used to pattern the nitride material has little effect on the isolation structures. In some examples, the blocking structure may be formed as a set of elongated features extending parallel to each other. In some examples, the second isolation structure may circumscribe additional isolation structures.

According to the present example, the method 800 includes a step 808 for forming a patterned photoresist layer over the semiconductor substrate such that the patterned photoresist layer covers the sub-portion while exposing remaining regions of the portion. The patterned photoresist layer may be formed by depositing a photoresist layer, exposing the photoresist layer to a light source through a photomask, and then developing the photoresist layer.

In some examples, after the development process, further fabrication processes may be applied to the substrate. For example, an ion implantation process (e.g., 116, FIG. 1C) may be applied. The implantation process may be used to introduce a dopant species into the exposed portions of the semiconductor substrate. Without use of the blocking structures, it is possible that the remaining photoresist feature may be reduced in size such that small sections of portion are exposed. This would be undesirable because it may allow sections of the exposed portions to be inadvertently doped.

After the implantation process, the remaining photoresist features may be removed. After the photoresist features are removed, semiconductor devices such as diodes transistors may be formed within the semiconductor substrate. Specifically, semiconductor devices may be formed in either exposed sub-portions or covered sub-portions. Forming diodes may involve further doping processes in forming contacts to connect to connect to the doped semiconductor portions. Forming transistors may involve forming gate devices, doping areas adjacent the gate devices, and forming contacts to the gates and areas (source/drain regions) adjacent the gate devices. Such devices will have improved performance due to the accuracy of photolithography process described herein.

According to one example, a method for fabricating a semiconductor device includes forming a plurality of isolation structures in a semiconductor substrate and forming a plurality of blocking structures over the isolation structures. The blocking structures have a lower reflectivity than the isolation structures. The method further includes forming a photoresist layer on the semiconductor substrate, exposing the photoresist layer to a light source through a mask, and developing the photoresist layer to create a patterned photoresist feature that covers a first region of a portion of the semiconductor substrate between two of the isolation structures. The portion of the semiconductor substrate having a second region that is exposed.

According to one example, the method further includes performing an implantation process to the second region.

According to one example, the portion of the semiconductor substrate includes an additional isolation structure that is not covered by a blocking structure.

According to one example, the portion of the semiconductor substrate includes a plurality of additional isolation structures that are not covered by a blocking structure.

According to one example, the portion of the semiconductor substrate is covered by a plurality of spaced apart patterned photoresist features after the developing.

According to one example, a length of a first blocking structure of the plurality of blocking structures is at least 50% of a length of the patterned photoresist feature along a first dimension.

According to one example, a length of a second blocking structure of the plurality of blocking structures is at least 50% of a length of the patterned photoresist feature along a second dimension perpendicular to the first dimension.

According to one example, the plurality of blocking structures includes polysilicon dummy gates.

According to one example, the polysilicon dummy gates have sidewall spacers thereon.

According to one example, the forming of the plurality of blocking structures over the isolation structures is done in a same process as forming real polysilicon gates.

According to one example, the plurality of blocking structures includes one of: metal gates or nitride structures.

According to one example, the plurality of blocking structures has a height of about 500 nanometers.

A method of fabricating a semiconductor device includes forming a first isolation structure into a semiconductor substrate so that the isolation structure circumscribes a portion of the semiconductor substrate, forming a second isolation structure within the portion of the semiconductor substrate so that the second isolation structure circumscribes a sub-portion of the semiconductor substrate, and forming a blocking structure over the first isolation structure. The blocking structure having a lower reflectivity than the first isolation structure. The method further includes forming a patterned photoresist layer over the semiconductor substrate such that the patterned photoresist layer covers the sub-portion while exposing remaining regions of the portion.

According to one example, the method further includes performing an implantation process on the remaining regions of the portion.

According to one example, the method further includes removing the patterned photoresist layer and forming a semiconductor device over the sub-portion.

According to one example, the semiconductor device comprises one of: a diode and a transistor.

According to one example, the blocking structure includes a plurality of separated segments positioned around the portion of the semiconductor substrate.

According to one example, a semiconductor device includes a semiconductor substrate, an isolation structure that is sized and shaped to isolate a two-dimensional array of separated portions of the semiconductor substrate, a plurality of blocking structures positioned over the isolation structure such that each of the separated portions of the semiconductor substrate are surrounded by the blocking structures, the blocking structures having a lower reflectivity than the isolation structure, and semiconductor devices formed within the separated portions.

According to one example, the blocking structures have a height within a range of about 450-550 nanometers.

According to one example, the blocking structures comprise polysilicon gate structures with sidewall structures formed thereon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
    forming a plurality of isolation structures in a semiconductor substrate;
    forming a plurality of blocking structures over the isolation structures, the blocking structures having a lower reflectivity than the isolation structures;
    forming a photoresist layer on the semiconductor substrate;
    exposing the photoresist layer to a light source through a mask; and
    developing the photoresist layer to create a patterned photoresist feature that covers a first region of a portion of the semiconductor substrate between two of the isolation structures, the portion of the semiconductor substrate having a second region that is exposed.

2. The method of claim 1, further comprising, performing an implantation process to the second region.

3. The method of claim 1, wherein the portion of the semiconductor substrate includes an additional isolation structure that is not covered by a blocking structure.

4. The method of claim 1, wherein the portion of the semiconductor substrate includes a plurality of additional isolation structures that are not covered by a blocking structure.

5. The method of claim 1, wherein the portion of the semiconductor substrate is covered by a plurality of spaced apart patterned photoresist features after the developing.

6. The method of claim 1, wherein a length of a first blocking structure of the plurality of blocking structures is at least 50% of a length of the patterned photoresist feature along a first dimension.

7. The method of claim 6, wherein a length of a second blocking structure of the plurality of blocking structures is at least 50% of a length of the patterned photoresist feature along a second dimension perpendicular to the first dimension.

8. The method of claim 1, wherein the plurality of blocking structures include polysilicon dummy gates.

9. The method of claim 8, wherein the polysilicon dummy gates have sidewall spacers thereon.

10. The method of claim 8, wherein the forming of the plurality of blocking structures over the isolation structures is done in a same process as forming real polysilicon gates.

11. The method of claim 1, wherein the plurality of blocking structures include one of: metal gates or nitride structures.

12. The method of claim 1, wherein the plurality of blocking structures have a height of about 500 nanometers.

13. A method of fabricating a semiconductor device comprising:
   forming a first isolation structure into a semiconductor substrate so that the isolation structure circumscribes a portion of the semiconductor substrate;
   forming a second isolation structure within the portion of the semiconductor substrate so that the second isolation structure circumscribes a sub-portion of the semiconductor substrate;
   forming a blocking structure over the first isolation structure, the blocking structure having a lower reflectivity than the first isolation structure; and
   forming a patterned photoresist layer over the semiconductor substrate such that the patterned photoresist layer covers the sub-portion while exposing remaining regions of the portion.

14. The method of claim 13, further comprising, performing an implantation process on the remaining regions of the portion.

15. The method of claim 13, further comprising:
   removing the patterned photoresist layer; and
   forming a semiconductor device over the sub-portion.

16. The method of claim 15, wherein the semiconductor device comprises one of:
   a diode and a transistor.

17. The method of claim 15, wherein the blocking structure includes a plurality of separated segments positioned around the portion of the semiconductor substrate.

18. A method for fabricating a semiconductor device, the method comprising:
   providing a semiconductor substrate;
   forming, within the substrate, an isolation structure that is sized and shaped to isolate a two-dimensional array of separated portions of the semiconductor substrate;
   forming a plurality of blocking structures positioned over the isolation structure such that each of the separated portions of the semiconductor substrate are surrounded by the blocking structures, the blocking structures having a lower reflectivity than the isolation structure; and
   forming semiconductor devices formed within the separated portions.

19. The method of claim 18, wherein the blocking structures have a height within a range of about 450-550 nanometers.

20. The method of claim 18, further comprising, forming polysilicon gate structures with sidewall structures on the blocking structures.

* * * * *